United States Patent
Ziglioli

(10) Patent No.: US 11,145,582 B2
(45) Date of Patent: Oct. 12, 2021

(54) METHOD OF MANUFACTURING SEMICONDUCTOR DEVICES WITH A PADDLE AND ELECTRICALLY CONDUCTIVE CLIP CONNECTED TO A LEADFRAME AND CORRESPONDING SEMICONDUCTOR DEVICE

(71) Applicant: STMicroelectronics S.r.l., Agrate Brianza (IT)

(72) Inventor: Federico Giovanni Ziglioli, Pozzo d'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/707,875

(22) Filed: Dec. 9, 2019

(65) Prior Publication Data

US 2020/0203264 A1 Jun. 25, 2020

(30) Foreign Application Priority Data

Dec. 24, 2018 (IT) .......................... 102018000020998

(51) Int. Cl.
| | |
|---|---|
| *H01L 23/00* | (2006.01) |
| *H01L 23/498* | (2006.01) |
| *H01L 21/48* | (2006.01) |
| *H01L 21/768* | (2006.01) |
| *H01L 23/31* | (2006.01) |
| *H01L 21/60* | (2006.01) |

(52) U.S. Cl.
CPC .... *H01L 23/49816* (2013.01); *H01L 21/4853* (2013.01); *H01L 21/76894* (2013.01); *H01L 23/3135* (2013.01); *H01L 23/49861* (2013.01); *H01L 24/13* (2013.01); *H01L 2021/60112* (2013.01); *H01L 2224/13* (2013.01)

(58) Field of Classification Search
None
See application file for complete search history.

(56) References Cited

U.S. PATENT DOCUMENTS

| | | | |
|---|---|---|---|
| 7,663,211 | B2 | 2/2010 | Noquil et al. |
| 8,049,312 | B2 | 11/2011 | Herbsommer et al. |
| (Continued) | | | |

FOREIGN PATENT DOCUMENTS

KR    1020160022121 A    2/2016

OTHER PUBLICATIONS

IT Search Report and Written Opinion for IT Appl. No. 102018000020998 dated May 29, 2019 (12 pages).

*Primary Examiner* — Reema Patel
(74) *Attorney, Agent, or Firm* — Crowe & Dunlevy

(57) ABSTRACT

A semiconductor chip is mounted on a leadframe. A first portion of an insulating package for the semiconductor chip is formed from laser direct structuring (LDS) material molded onto the semiconductor chip. A conductive formation (provided by laser-drilling the LDS material and plating) extends between the outer surface of the first portion of insulating package and the semiconductor chip. An electrically conductive clip is applied onto the outer surface of the first portion of the insulating package, with the electrically conductive clip electrically coupled to the conductive formation and the leadframe. A second portion of the insulating package is made from package molding material (epoxy compound) molded onto the electrically conductive clip and applied onto the outer surface of the first portion of the insulating package.

13 Claims, 11 Drawing Sheets

(56) References Cited

U.S. PATENT DOCUMENTS

2004/0266037 A1 12/2004 Knapp et al.
2007/0114352 A1 5/2007 Cruz et al.
2008/0173991 A1 7/2008 Cruz et al.
2010/0297810 A1 11/2010 Otremba et al.
2013/0146991 A1 6/2013 Otremba et al.
2016/0163671 A1 6/2016 Kumar et al.

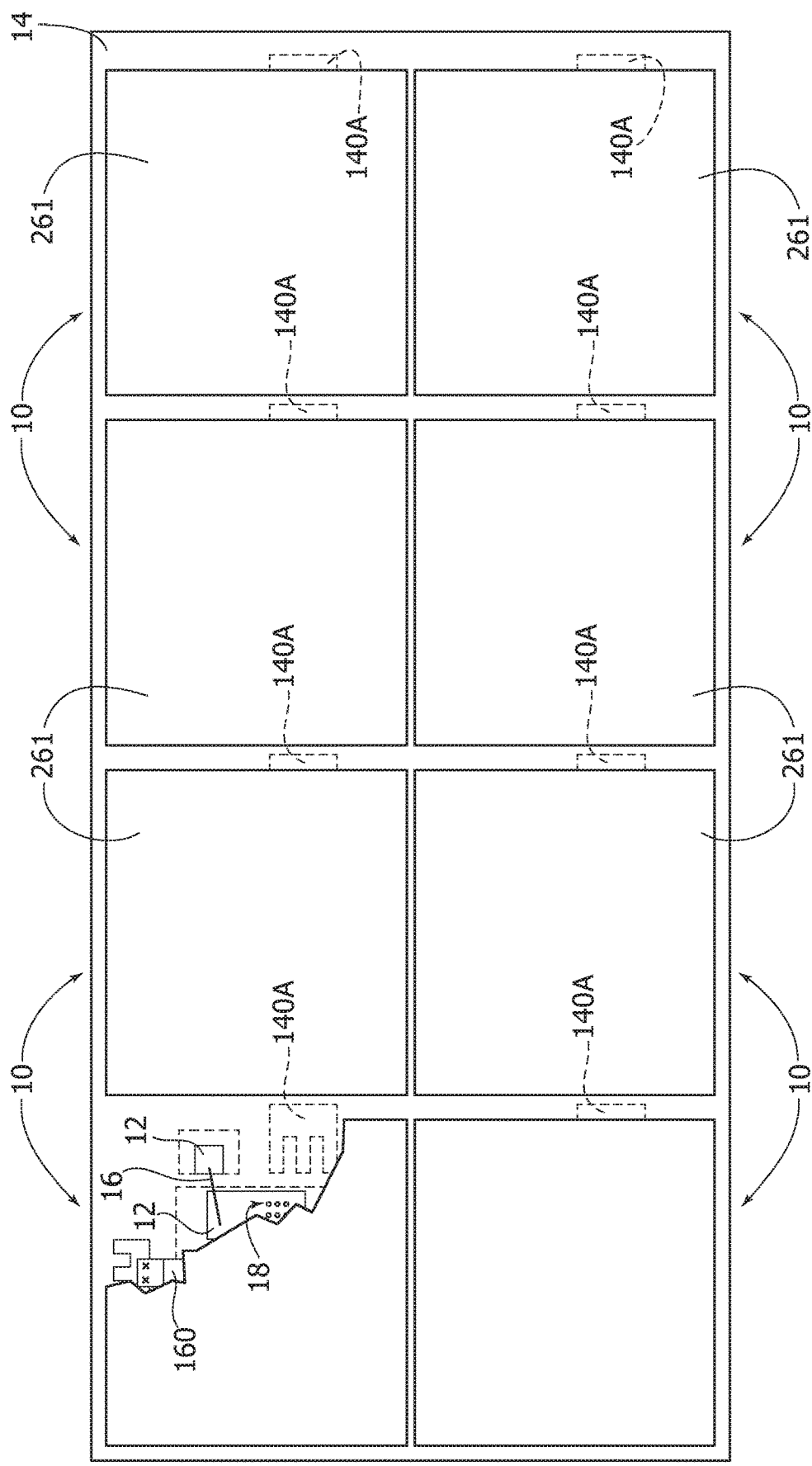

METHOD OF MANUFACTURING SEMICONDUCTOR DEVICES WITH A PADDLE AND ELECTRICALLY CONDUCTIVE CLIP CONNECTED TO A LEADFRAME AND CORRESPONDING SEMICONDUCTOR DEVICE

PRIORITY CLAIM

This application claims the priority benefit of Italian Application for Patent No. 102018000020998, filed on Dec. 24, 2018, the content of which is hereby incorporated by reference in its entirety to the maximum extent allowable by law.

TECHNICAL FIELD

The description relates to manufacturing semiconductor devices, such as integrated circuits (ICs).

One or more embodiments may be applied to semiconductor packages, e.g., of QFN (Quad-Flat No-Lead) type.

Power ICs (so-called "smart" power ICs, for instance) for use in the automotive, industrial and consumer sectors, using QFN packages are exemplary of possible areas of application of embodiments.

BACKGROUND

Power QFN circuits can use clips, attached with soft solder, for instance.

Clips such as copper clips may be adopted in the place of conventional wirebond interconnect with the aim of facilitating lower resistance and inductance, while also improving thermal performance.

Clips "customized" for a certain device type can be mounted directly on the semiconductor pads.

Resorting to that solution may turn out to be complicated in the presence of multiple dice (stacked or side-by-side) or in the case of mixed packages also comprising wiring, such as wire bonding for gate or trigger functions or for digital signals in smart power technology applications.

Customized clips may represent a significant part of package cost.

Universal clips have been proposed, but they are expensive and complex to assemble.

Also, attaching clips via soft-solder may turn out to be an intrinsically "dirty" process which may require additional cleaning steps.

There is a need in the art to overcome the foregoing drawbacks of conventional solutions.

SUMMARY

One or more embodiments relate to a semiconductor device (a QFN power package, for instance).

One or more embodiments comprise a clip-QFN package manufactured with a molding process comprising laser direct structuring (LDS) applied to sealing the components (with wires, ribbons, vias, etc.) with a custom paddle formed with, e.g. copper, electroplating following LDS laser writing; a standard clip (single size/shape) can be soldered to the top paddle and to the leadframe.

One or more embodiments may comprise, after clip soldering, a secondary molding step for sealing the package.

One or more embodiments facilitate providing power QFN packages offering a high degree of flexibility in substrate design (for instance, a bare Cu strip with routing design for back etching process) while also facilitating the use of clips to handle high power levels (for IGBT applications, for instance).

In one or more embodiments, clips can be standard versus package cavity size (LDS molding cavity).

In one or more embodiments, the process of clip soldering (even with standard processes) will have no impact on the flow, as the process can be performed on an already molded package.

One or more embodiments, as possibly applied to smart power technology (bipolar-CMOS-DMOS or BCD technology, for instance), facilitate cost reduction by resorting to a solution based on LDS.

BRIEF DESCRIPTION OF THE DRAWINGS

One or more embodiments will now be described, by way of example only, with reference to the annexed figures, wherein:

FIGS. 6 through 13 are exemplary of steps in a method according to embodiments of the present description, with FIGS. 7A, 7B and 7C representing details of the provision of vias and FIG. 9 being in the form of a flow chart.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

It will be otherwise appreciated that details and features herein discussed, singly or in combination, in connection with any one of the figures are not necessarily limited to use in embodiments as exemplified in that figure; such details and features may in fact be applied, singly or in combination, in embodiments as exemplified in any other of the figures annexed herein.

As noted, power QFN circuits can use clips, attached with soft solder, for instance, as a replacement of conventional wirebond interconnect with the aim of facilitating lower resistance and inductance, while also improving thermal performance.

Documents such as U.S. Pat. Nos. 7,663,211B2 and 8,049,312B2, and United States Patent Application Publication Nos. 2007/0114352A1 and 2008/0173991A1, all of which are incorporated by reference, are exemplary of known arrangements which may suffer from various drawbacks as discussed in the foregoing.

Figure 1:
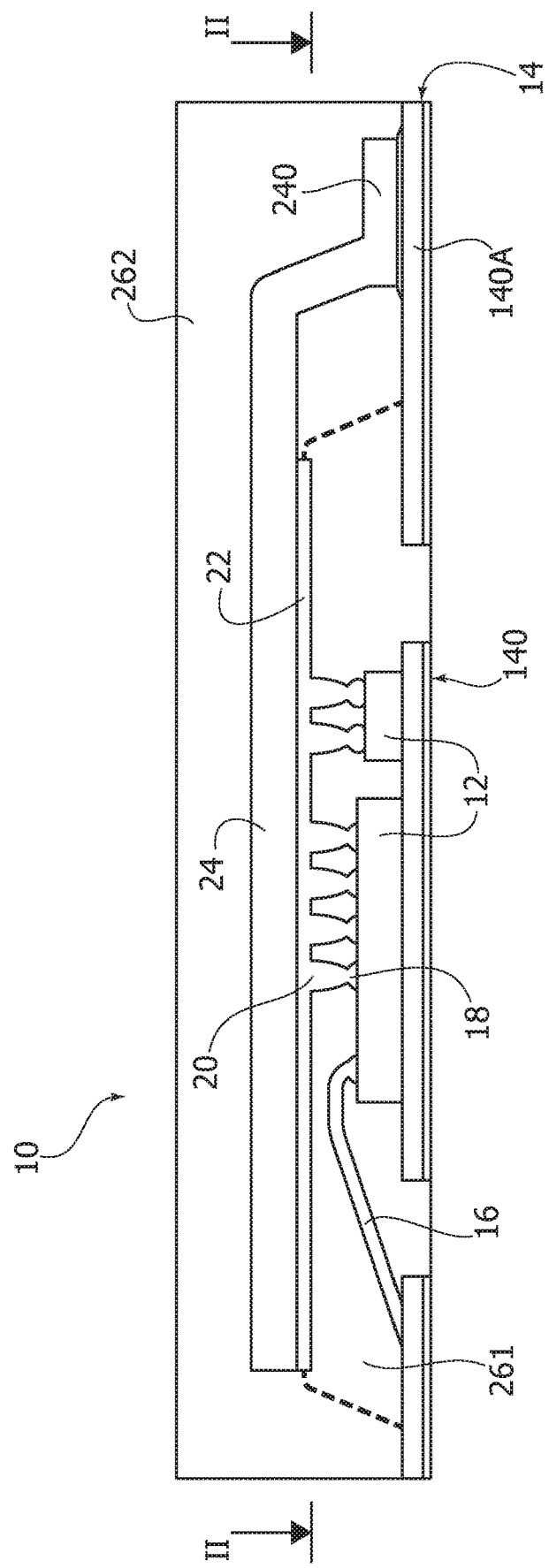
FIG. 1 is a cross-sectional view across a device according to embodiments of the present description.

FIG. 1 is a cross-sectional view across a device 10 (in the form of an integrated circuit or IC, for example) according to embodiments of the present description.

As exemplified herein, the device 10 includes one or more semiconductor chips or dice 12 arranged at a die pad portion 140 of a leadframe 14.

Electrical connection lines (signal and power, for instance) for the chip(s) or die/dice 12 may be provided (at the front or top surface thereof, for instance):

via wire/ribbon) bonding 16, 160 (to the outer portion of the leadframe 14) and/or via stud bumps 18 and vias 20 to a routing network and paddle 22 for a clip 24.

As exemplified herein, the clip 24 extends above the front or top surface of the chip(s) or die/dice 12, with an extension 240 facilitating electrical (and mechanical) coupling to the outer portion of the leadframe 14.

As discussed previously, replacing (wholly or partly) wirebond/ribbon interconnect via clips such as copper clips is conventional in the art, which makes it unnecessary to provide a more detailed description herein.

A (single) device 10 as exemplified in FIG. 1 also includes device package comprising:

first package material 261, whose extent is shown by the dotted lines, comprising laser direct structuring (LDS) material arranged intermediate the leadframe 14 (with the chip(s) or die/dice 12) and the clip 24 (with the associated paddle 22) so that the vias 20 (and the wire bonding 16) extend through the first package material 261, and second package material 262, comprising conventional package material (epoxy material, for instance) completing the device package by extending over the clip 24 (opposite the chip(s) or die/dice 12) and the outer portion of the leadframe 14.

As well known to those of skill in the art, laser direct structuring (LDS) is a technology adopted in various areas which may involve molding (injection molding, for instance) of resins containing additives. A laser beam can be applied to the surface of a molded part in order to transfer thereto a desired pattern. A metallization process such as an electro-less plating process, involving metals such as copper can then be used to plate a desired conductive pattern on the laser-treated surface. LDS processing is also known to be suited for providing vias or contact pads.

In FIGS. 2-5, parts or elements like parts or elements already discussed in connection with FIG. 1 are indicated by like references and a corresponding description will not be repeated for brevity.

Figure 2:
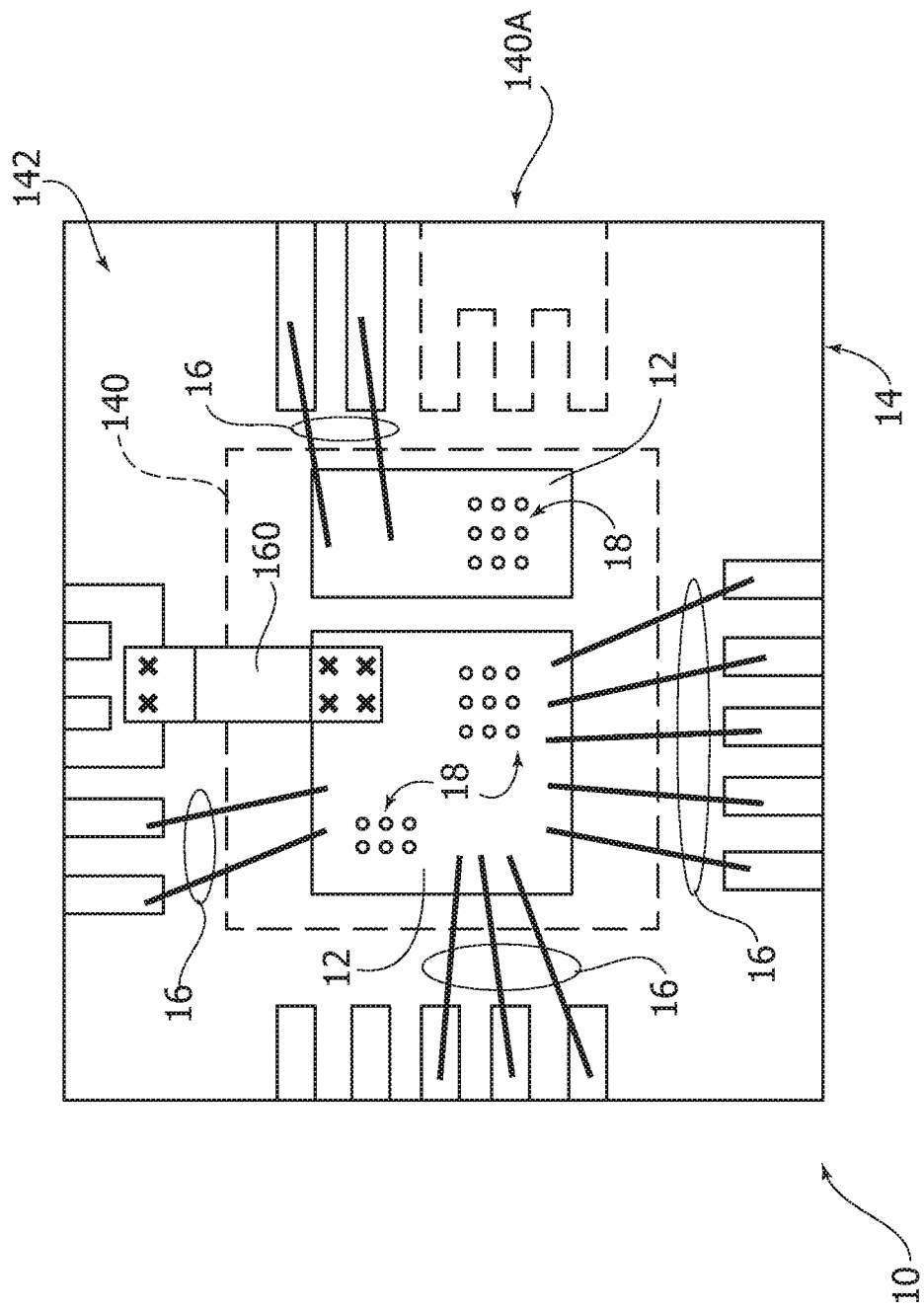
FIG. 2 is a plan view exemplary of certain parts of a device according to embodiments of the present description with certain parts lying above the plane II-II of FIG. 1 removed for ease of illustration.

Essentially, FIG. 2 is a plan view exemplary of certain parts of a device 10 according to embodiments of the present description with certain parts lying above the plane II-II of FIG. 1 removed for ease of illustration.

FIG. 2 is further exemplary of the possibility of mixing (that is, using) ribbons, as exemplified at 160, together with bonding wires 16 and stud bumps 18.

Stud bumps 18 may be used as a base for laser drilling (as discussed in the following) and may be both a single or a multiple stack.

FIG. 2 also highlights at reference 142 an area in the leadframe 14 which may be removed with back etching and the provision of a pad area 140A of the leadframe 14 for coupling with the clip extension 240.

Figure 3:
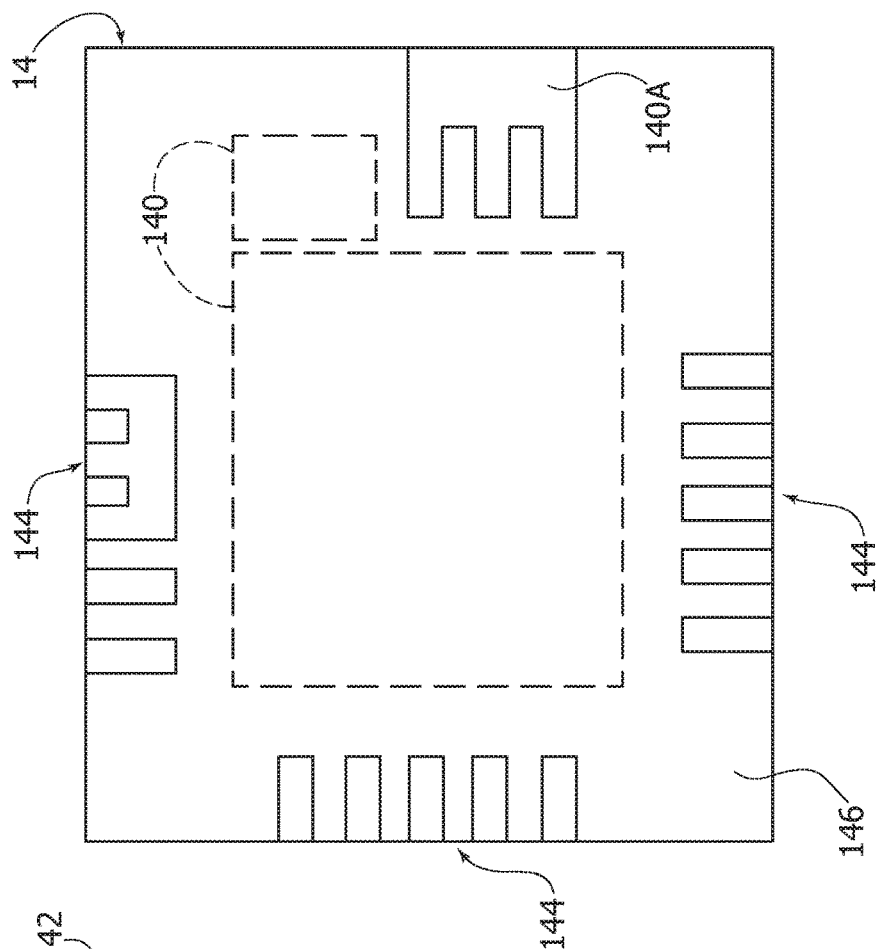
FIGS. 3 and 4 are further views similar to the view of FIG. 2 and exemplary of certain parts of a device according to embodiments of the present description.

FIG. 3 further expands on FIG. 2 by highlighting the possibility of providing multiple areas ("islands") in the die pad 140 to host other chips or dice 12.

Figure 4:
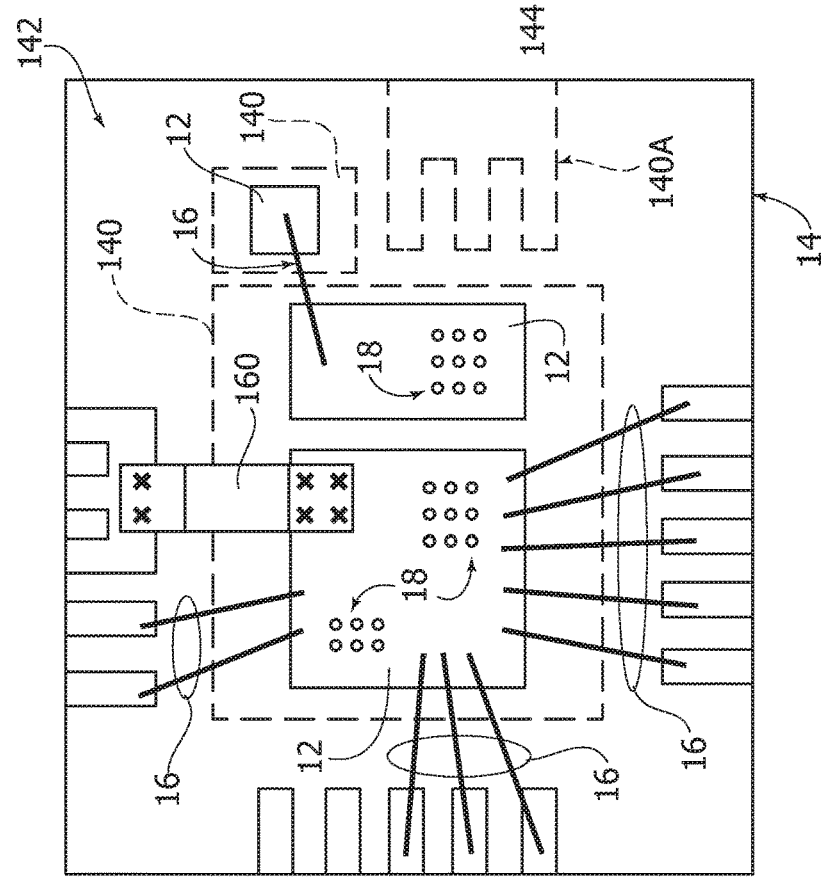

FIG. 4 is a bottom-level representation of the leadframe 14. Such a representation contrasts no-etching areas at the die pad islands 140, the pad area 140A and at the leads the outer portion of the leadframe 14 (collectively indicated as 144) with etching areas (Cu etching areas, for instance) 146 of the leadframe 14.

Figure 5:
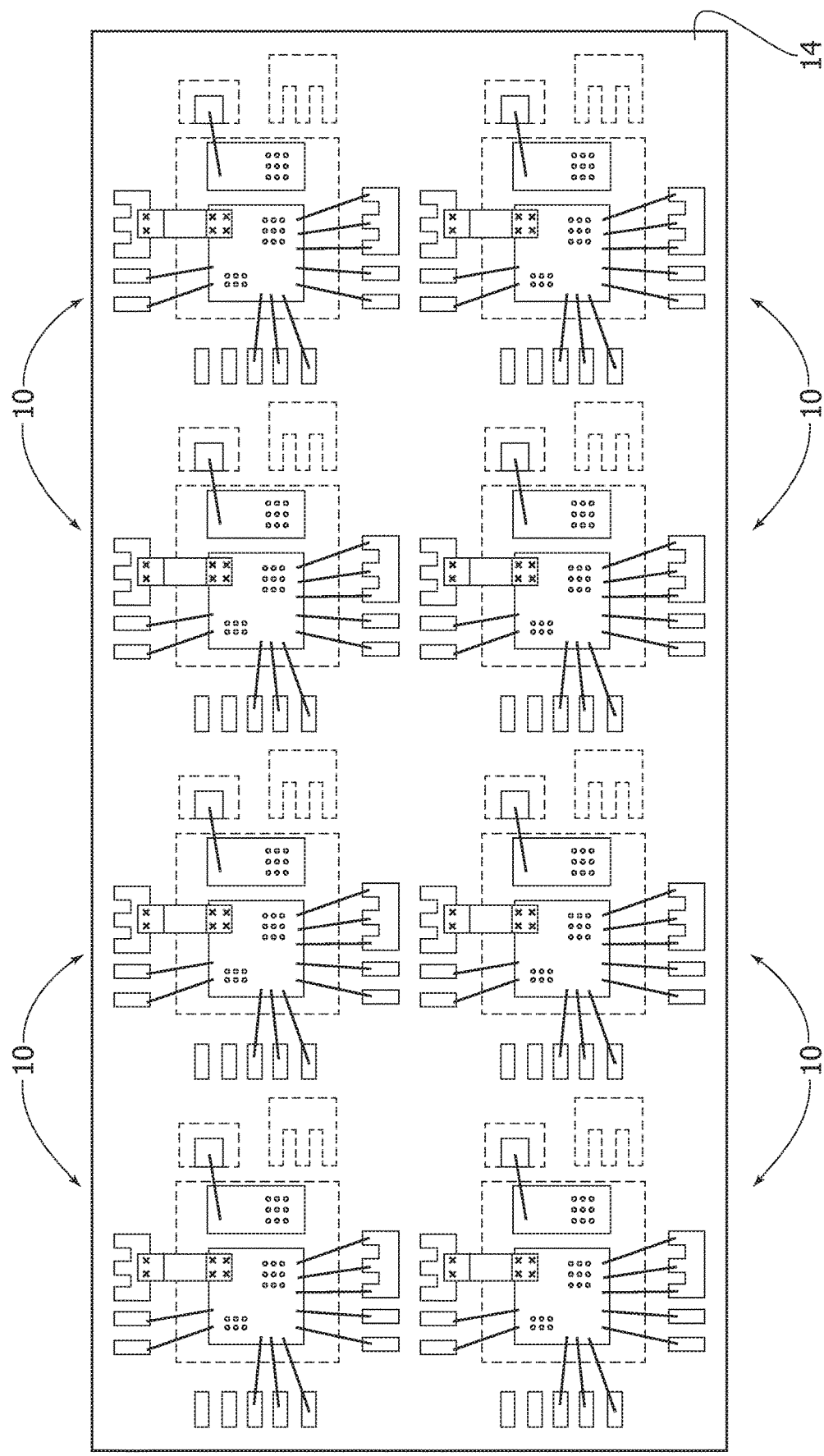
FIG. 5 is exemplary of the possible extension of embodiments of the present description to multiple strips of devices.

FIG. 5 is generally exemplary of the possibility of extending a basic structure of a device 10 and the steps in the manufacturing process discussed in the following to a "multiple" strip arrangement.

For simplicity, only the possible locations of individual devices 10 at a leadframe 14 (eight such locations being shown is merely exemplary) are indicated in FIG. 5, being otherwise understood that the same references/designations of the single location shown in FIGS. 3 and 4 apply to the plural locations in FIG. 5.

Clip-QFN devices as exemplified in FIGS. 1 to 5 can be manufactured with a double molding process.

A first step (or set of steps) in a process as exemplified herein may involve providing for the or each device/location 10 the basic structure of FIG. 3, namely one or more semiconductor chips or dice 12 arranged at die pad portions 140 of a leadframe 14 along with wire bonding 16 and/or ribbon connections 160 towards respective outer leadframe portions.

Such a first step (or set of steps) involves conventional criteria and technology, which makes it unnecessary to provide a more detailed description herein.

This also applies to creating (at the top surface of the chip(s) or die/dice 12) stud bumps 18 at positions where vias 20 will be laser-drilled as discussed in the following.

Providing stud bumps 18 was also found to be beneficial in order to protect the corresponding silicon sites (pads) from the laser beam used for drilling (for instance, depending on the laser beam used and/or the thickness of the LDS compound 261 over the chip(s) or die/dice 12).

FIG. 6 is exemplary of a first molding step of LDS material onto the strip arrangement of FIG. 5 aimed at creating the first mass of (electrically insulating) LDS package material 261 of FIG. 1 embedding the chip(s) or die/dice 12 as well as the wire bonding 16 and/or ribbon connections 160 towards respective outer leadframe portions associate therewith.

Materials such as epoxy-based molding compounds with filler adapted to be activated by laser radiation, or liquid crystal polymers may be exemplary of LDS material which may be used in embodiments.

Figure 7A:
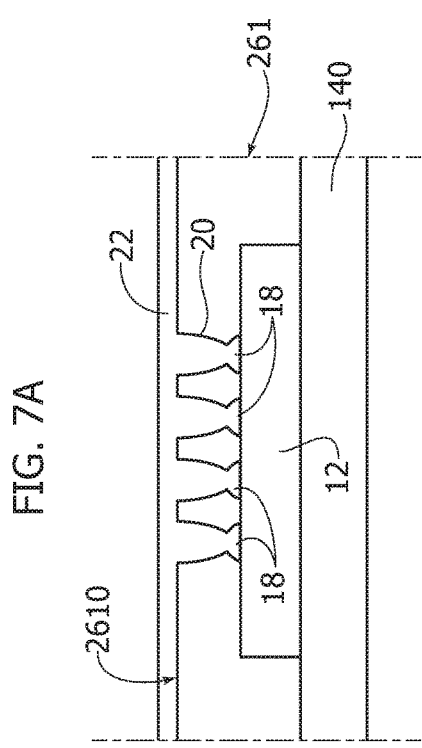
Figure 7B:
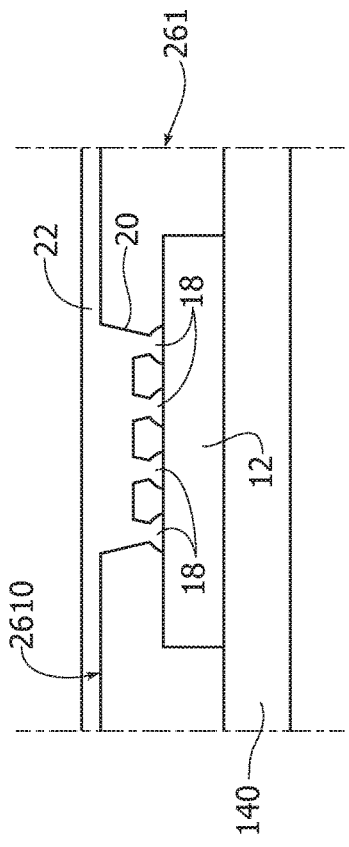
Figure 7C:
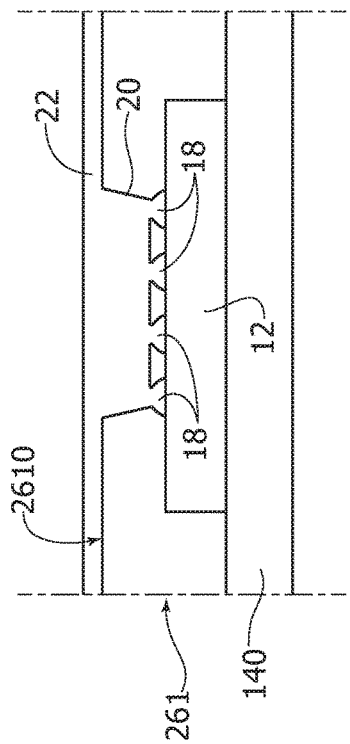

FIGS. 7A to 7C are exemplary of the creation of vias 20 extending through the first mass of LDS package material 261 at the pad locations where connections with the clip 22, 24 are desired.

This may involve laser-drilling the LDS material 461 at the locations where stud-bumps as 18 were provided at the top surface of the chip(s) or die/dice 12.

As exemplified in FIGS. 7A to 7C, laser drilling of the LDS material 261 may involve drilling through the thickness of the LDS package material 261, starting from an outer surface 2610 of the LDS material 261:
    one via for each stud bump 18 (FIG. 7A);
    one common aperture on a certain stud bump area and individual short vias extending down to respective stud bumps 18 (FIG. 7B);
    one common aperture extending down to the stud bumps 18 (FIG. 7C).

Whatever the option adopted, after LDS activation by laser the wall of the aperture(s) thus formed can be plated (Cu plated, for instance) by resorting to conventional plating technology in order to complete the structure by connecting the pads on the chip(s) or die/dice 12 (the stud bumps 18, for instance) to a paddle 22 for clip soldering created "on top" of the LDS body 261 having the vias 20 extending therethrough.

Figure 8:
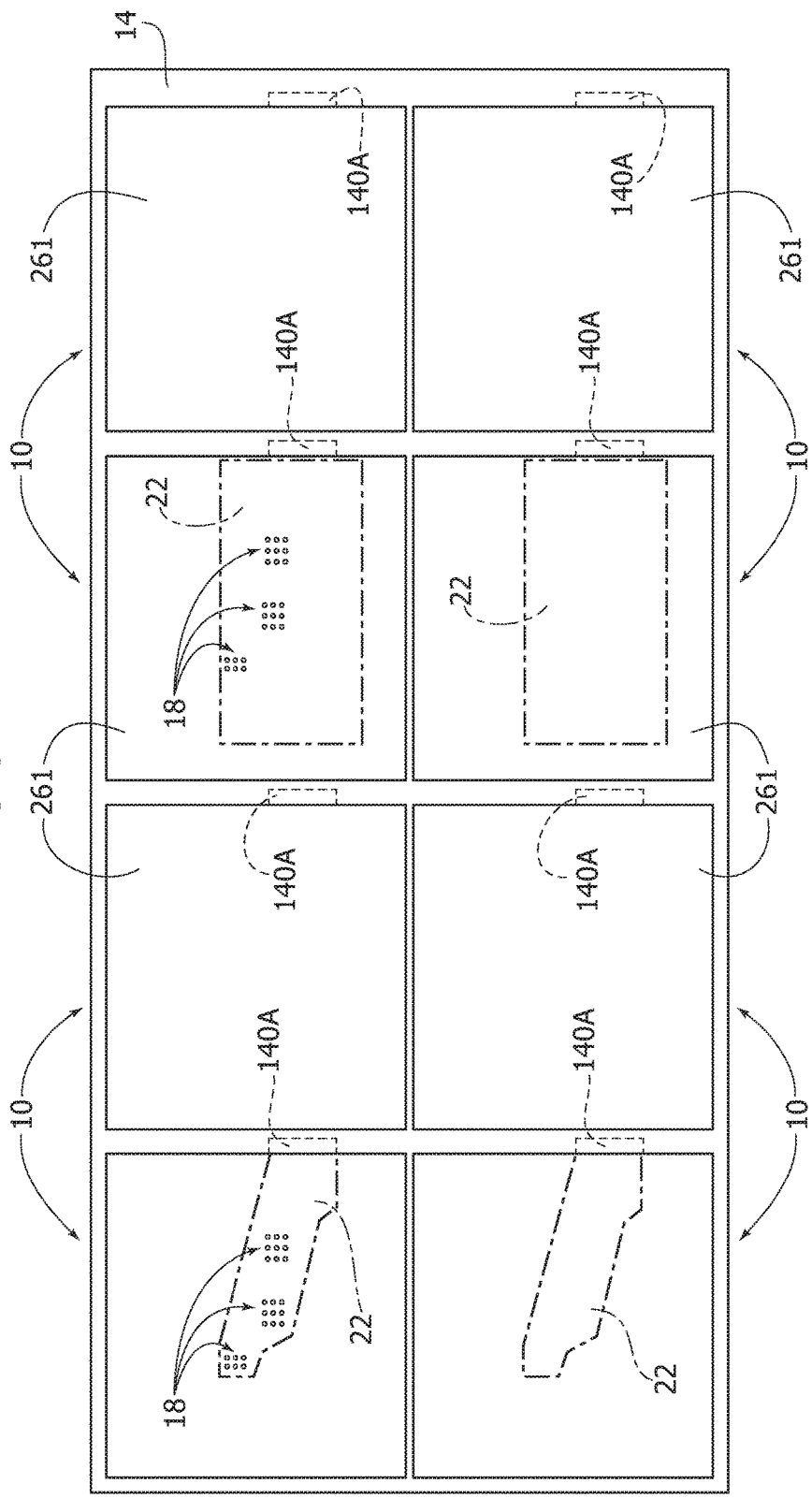

Such steps are schematically represented in FIG. 8, where exemplary locations of stud bumps 18/vias 20 are shown corresponding to those exemplified in FIGS. 5 and 6.

FIG. 8 is also exemplary of the possibility of performing the plating process by providing paddle shapes selected according to desired shapes.

Figure 9:
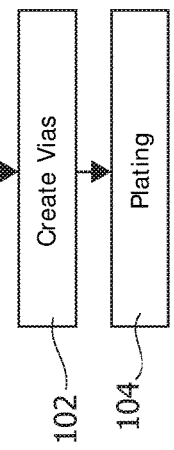

The flow chart of FIG. 9 is exemplary of a corresponding possible sequence of steps including creating a desired routing/shape by lasering (block 100), creating the vias 20 over the areas of stud bumps 18 (block 102) and plating (galvanic plating, for instance—block 104).

Figure 10:
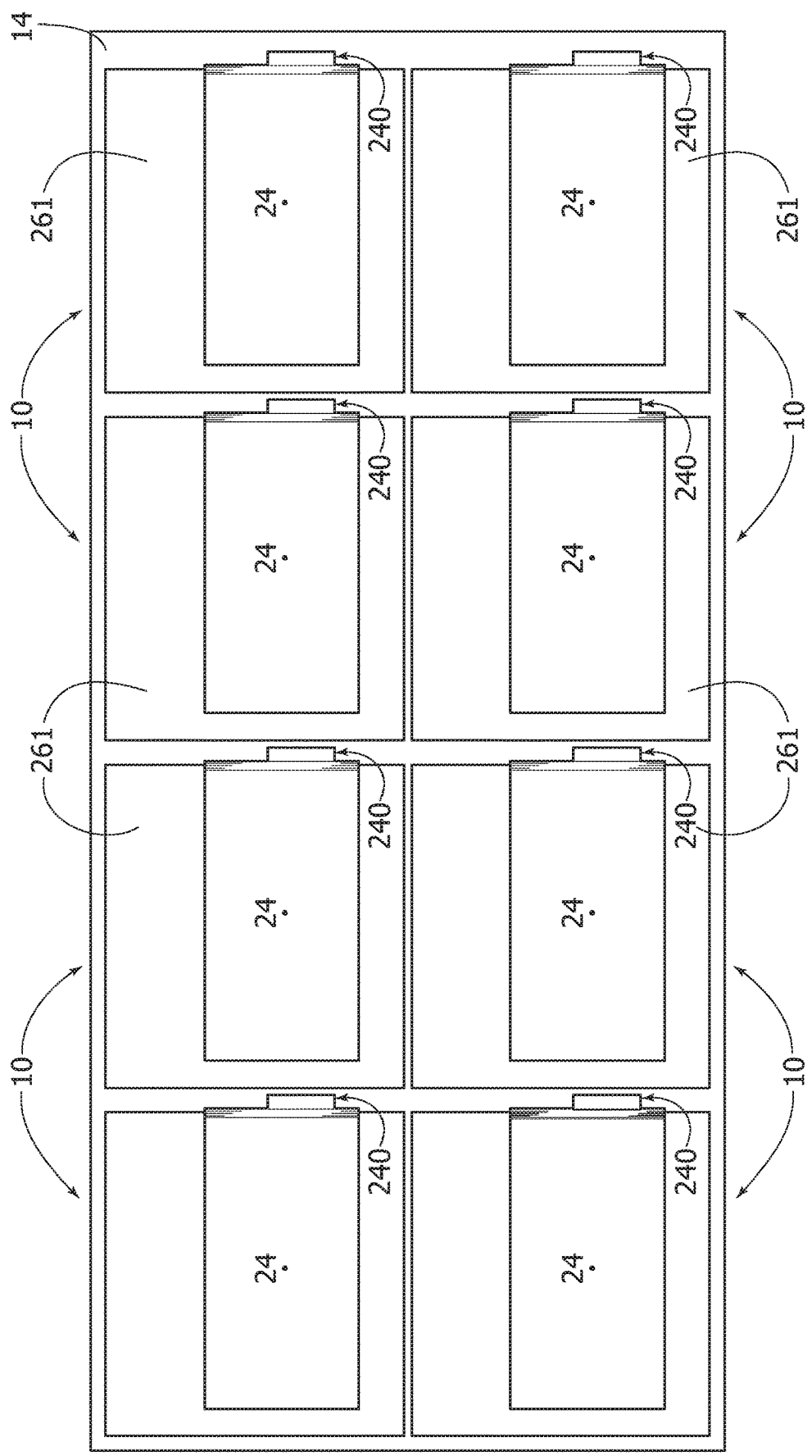

As exemplified in FIG. 10, the clip 24 can then be attached to the top paddle 24 and to the leadframe 14 (at 140A via the extension 240). In one or more embodiments, the clip 24 can be attached to the paddle 22 by solder welding or laser welding.

It will be appreciated that the clip 24 can be of a standard type adapted to be accommodated in the molding cavity size used for the first molding step of the LDS material 261.

Figure 11:
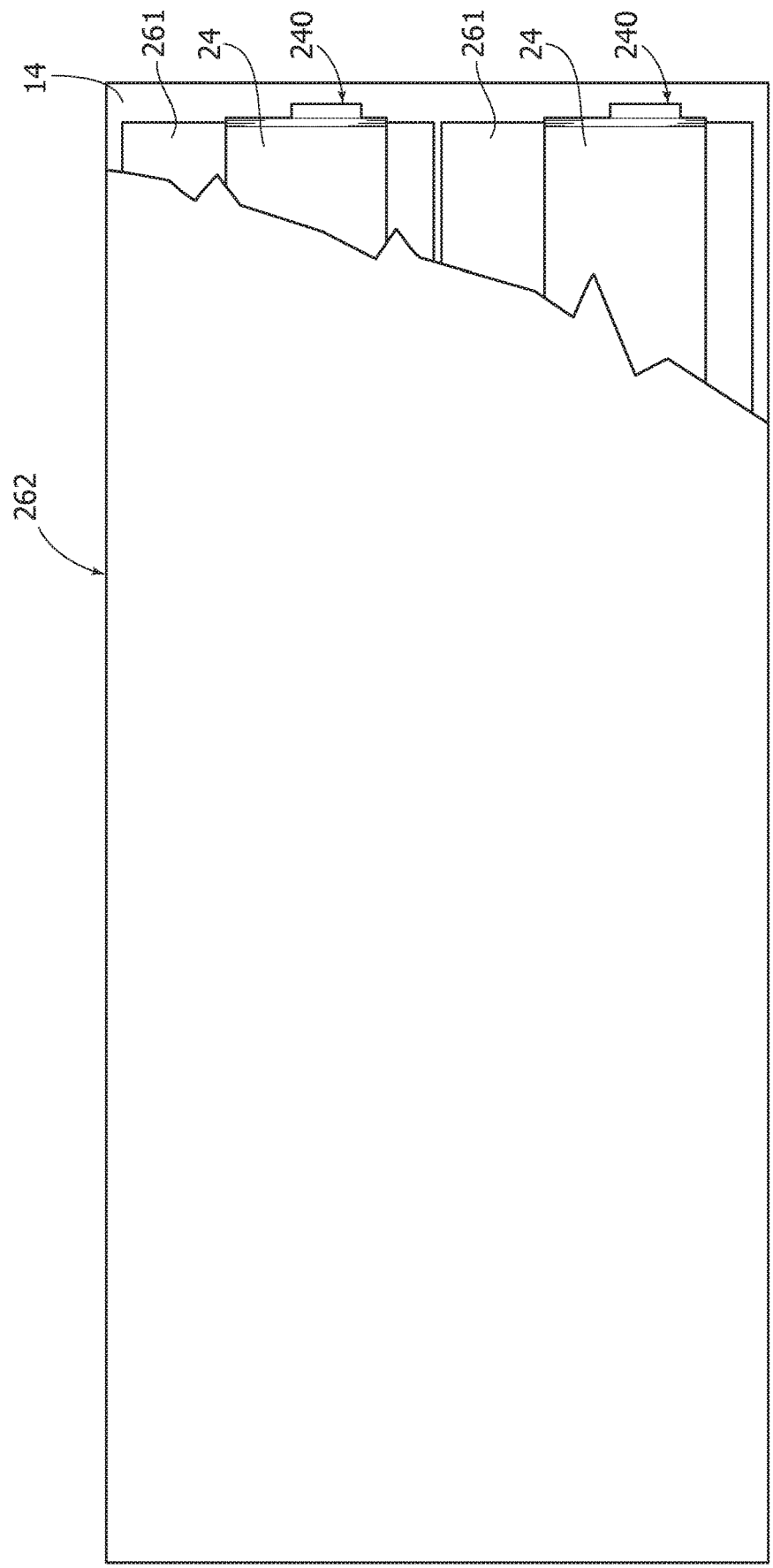

As exemplified in FIG. 11, after clip soldering, in a secondary (over) molding step of conventional package material (of any known type suited for that purpose, epoxy compound, for instance) the second mass of package material 262 of FIG. 1 may be applied onto the structure shown in FIG. 10 for finally sealing the package.

Figure 12:
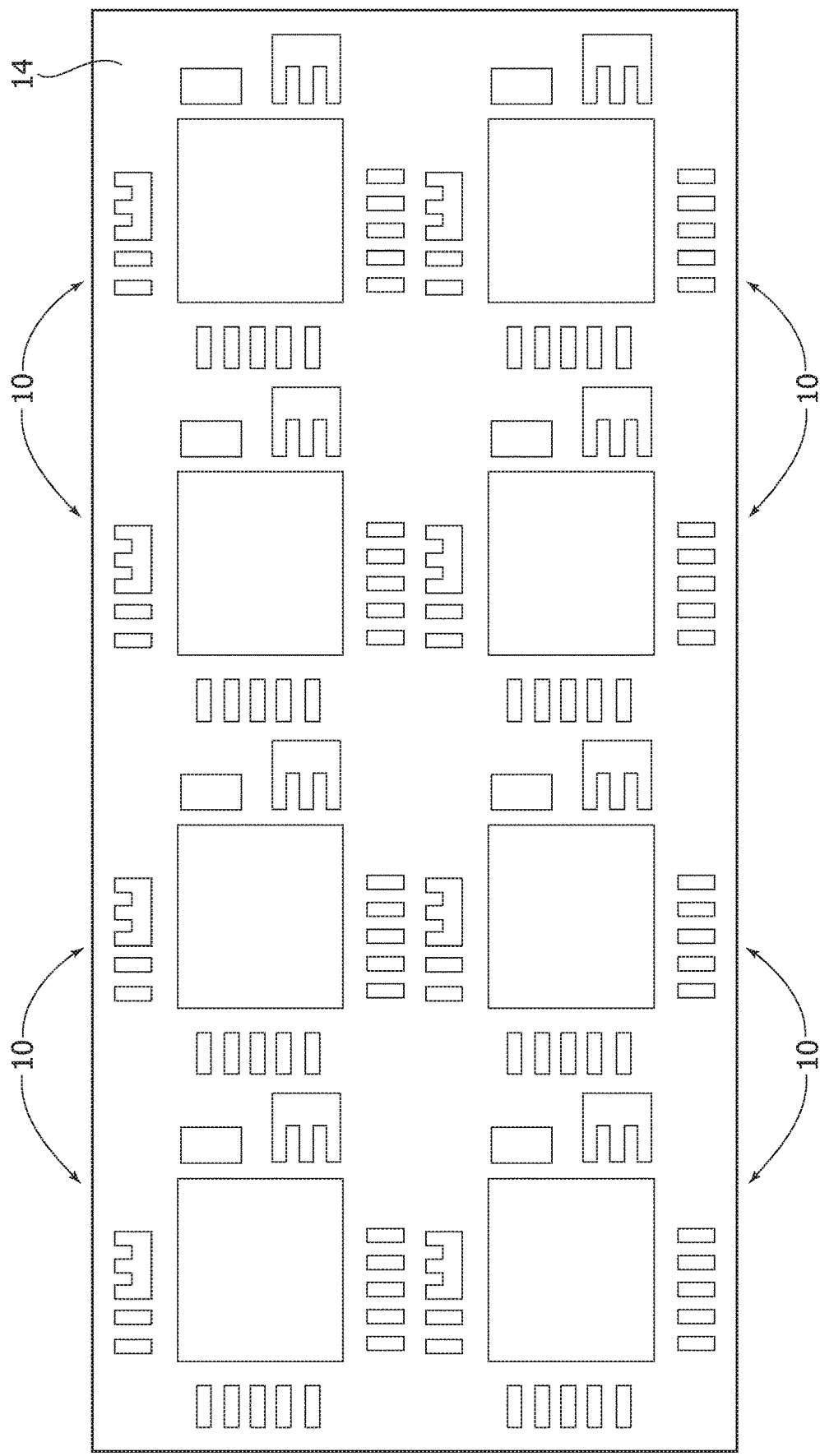
Figure 13:
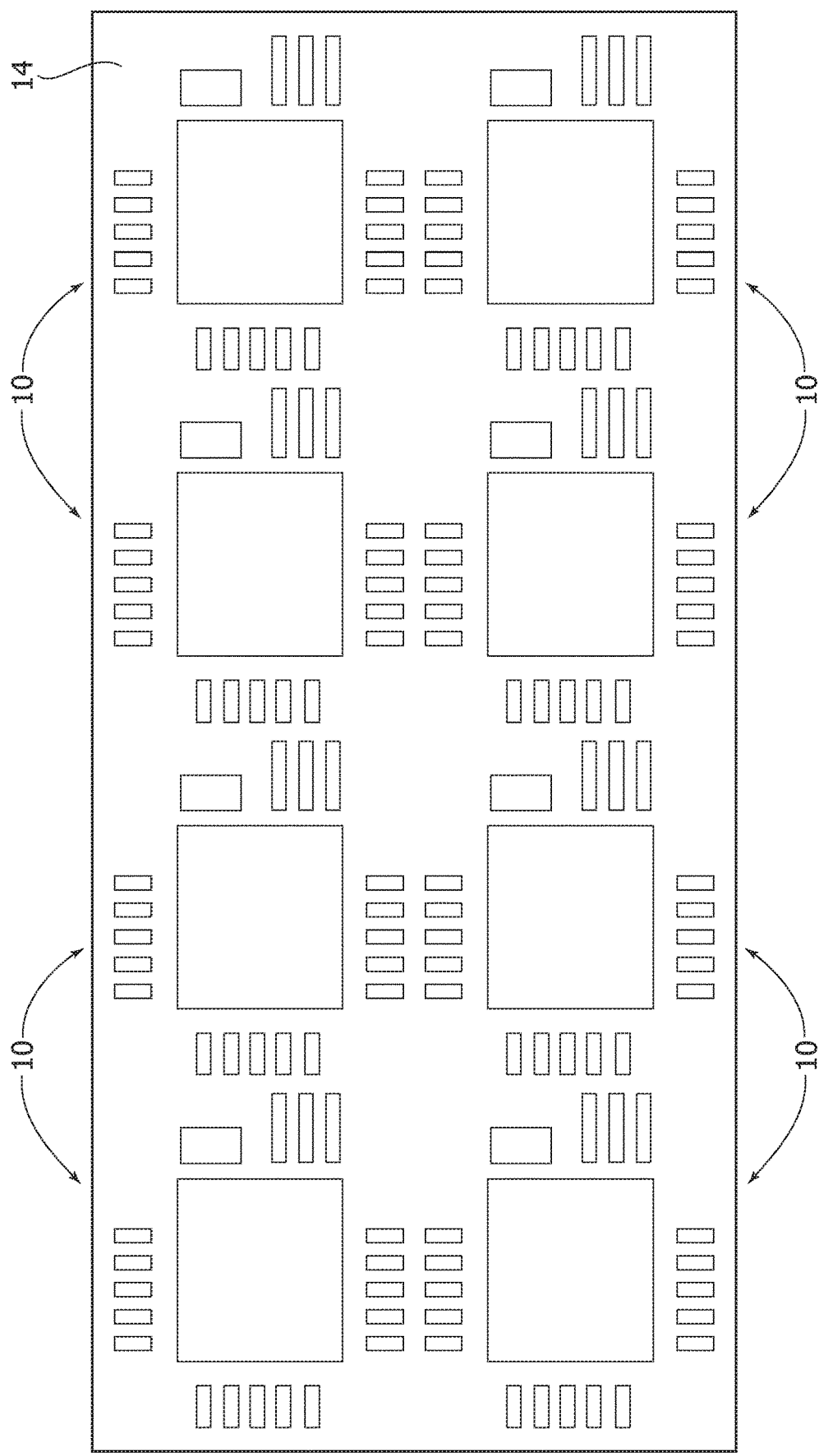

FIGS. 12 and 13 are generally exemplary of final steps (involving the use of conventional technologies) of back etching (FIG. 12) to expose the pads of the leadframe and pad definition (FIG. 13) involving, for instance, resist covering to create pad openings at the device bottom surface. Dicing (again by resorting to conventional technologies) may then lead to singulation of individual devices 10 as exemplified in FIG. 1.

A method as exemplified herein may comprise:
    providing a leadframe (for instance, 14) having at least one semiconductor chip (for instance, 12) thereon,
    molding onto the at least one semiconductor chip on the leadframe laser direct structuring, LDS, material to provide at least one portion (for instance, 261) of (electrically) insulating package for the at least one semiconductor chip on the leadframe, the at least one portion of insulating package having an outer surface (for instance, 2610),
    providing at least one electrically conductive formation (for instance, one or more vias 20) extending between the outer surface of the at least one portion of insulating package and the at least one semiconductor chip on the leadframe,
    applying onto the outer surface of the at least one portion of insulating package an electrically conductive clip (for instance, 24), the clip electrically coupled to the at least one electrically conductive formation and the leadframe (for instance, at 140A) with the at least one semiconductor chip located intermediate the leadframe and the clip.

A method as exemplified herein may comprise molding onto the clip applied onto the outer surface of the at least one portion of insulating package molding material to provide at least one further portion (for instance, 262) of package for the at least one semiconductor chip on the leadframe.

A method as exemplified herein may comprise providing on the at least one semiconductor chip at least one contact stud bump (for instance, 18) facing said at least one electrically conductive formation.

A method as exemplified herein may comprise providing at the outer surface of the at least one portion of insulating package a mounting paddle (for instance, 22) for said clip.

In a method as exemplified herein providing said at least one electrically conductive formation may comprise:
    laser drilling (for instance, 102) the laser direct structuring material to provide at least one hole therethrough, and
    plating (for instance, 104) the inner wall of said at least one hole.

A method as exemplified herein may comprise providing said mounting paddle for said clip by plating the outer surface of the at least one portion of insulating package.

A method as exemplified herein may comprise applying the electrically conductive clip onto the outer surface of the at least one portion of insulating package via solder welding or laser welding.

A method as exemplified herein, wherein the clip is intended to only partly replace wire/ribbon bonding, may comprise providing at least one electrically conductive wire (for instance, 16) and/or ribbon (for instance, 160) bonding formation between the leadframe and the at least one semiconductor chip, wherein providing at least one electrically conductive wire and/or ribbon bonding formation is prior to molding onto the at least one semiconductor chip on the leadframe said laser direct structuring material wherein the at least one electrically conductive wire and/or ribbon bonding formation is embedded in the at least one portion of insulating package.

A semiconductor device (for instance, 10) as exemplified herein, may comprise:
    a leadframe having at least one semiconductor chip thereon,
    laser direct structuring material molded onto the at least one semiconductor chip on the leadframe to provide at least one portion of insulating package for the at least one semiconductor chip on the leadframe, the at least one portion of insulating package having an outer surface,
    at least one electrically conductive formation extending between the outer surface of the at least one portion of insulating package and the at least one semiconductor chip on the leadframe,
    an electrically conductive clip applied onto the outer surface of the at least one portion of insulating package, the clip electrically coupled to the at least one electrically conductive formation and the leadframe with the at least one semiconductor chip located intermediate the leadframe and the clip.

A semiconductor device as exemplified herein may comprise at least one further portion of package for the at least one semiconductor chip on the leadframe, the at least one further package portion comprising package molding material molded onto the clip applied onto the outer surface of the at least one portion of insulating package.

A semiconductor device as exemplified herein may comprise one or more of the following features:

at least one contact stud bump provided on the at least one semiconductor chip on the leadframe facing said at least one electrically conductive formation; and/or a mounting paddle for said clip at the outer surface of the at least one portion of insulating package; and/or at least one electrically conductive wire and/or ribbon bonding formation between the leadframe and the at least one semiconductor chip, the at least one electrically conductive wire and/or ribbon bonding formation embedded in the at least one portion of insulating package.

Without prejudice to the underlying principles, the details and embodiments may vary, even significantly, with respect to what has been disclosed by way of example only, without departing from the extent of protection.

The claims are an integral portion of the disclosure of the invention as provided herein.

The invention claimed is:

1. A method, comprising:
   molding a laser direct structuring material onto at least one semiconductor chip which is mounted on a leadframe, the molded laser direct structuring material providing at least one portion of an insulating package for the at least one semiconductor chip, the at least one portion of the insulating package having an outer surface;
   providing at least one electrically conductive formation extending between the outer surface of the at least one portion of the insulating package and the at least one semiconductor chip, wherein providing the at least one electrically conductive formation comprises:
   forming an opening extending through the molded laser direct structuring material to expose at least one contact of said at least one semiconductor chip; and
   filling the opening with an electrically conductive material;
   providing a mounting paddle on the outer surface of the at least one portion of the insulating package and in contact with said at least one electrically conductive formation; and
   applying an electrically conductive clip onto the mounting paddle at the outer surface of the at least one portion of the insulating package, said electrically conductive clip being electrically coupled to said at least one semiconductor chip through the at least one electrically conductive formation; and
   electrically connecting the electrically conductive clip to the leadframe, with the at least one semiconductor chip located intermediate the leadframe and the electrically conductive clip.

2. The method of claim 1, further comprising molding a molding material onto the electrically conductive clip applied onto the outer surface of the at least one portion of the insulating package, said molding material providing at least one further portion of the insulating package for the at least one semiconductor chip.

3. The method of claim 1, wherein said at least one contact stud bump faces said at least one electrically conductive formation.

4. The method of claim 1, wherein providing said mounting paddle comprises plating the outer surface of the at least one portion of the insulating package.

5. The method of claim 1, wherein providing said at least one electrically conductive formation comprises:
   laser drilling at least one hole extending through the laser direct structuring material; and
   plating an inner wall of said at least one hole.

6. The method of claim 1, wherein applying the electrically conductive clip comprises performing one of a solder welding or a laser welding.

7. The method of claim 1, further comprising, prior to molding the laser direct structuring material, providing at least one electrically conductive wire and/or ribbon bonding formation between the leadframe and the at least one semiconductor chip, wherein the at least one electrically conductive wire and/or ribbon bonding formation is embedded in the at least one portion of insulating package.

8. A method, comprising:
   mounting a semiconductor chip to a leadframe;
   forming a contact stud bump on the semiconductor chip;
   molding a laser direct structuring material onto said semiconductor chip and said contact stud bump;
   laser drilling a hole extending through the molded laser direct structuring material, wherein said hole exposes said contact stud bump;
   laser activating sidewalls of said hole;
   plating the activated sidewalls to form a via;
   forming a paddle on an upper surface of the molded laser direct structuring material, said paddle in contact with the via;
   attaching an electrically conductive clip onto the paddle, wherein said electrically conductive clip is electrically coupled to the semiconductor chip through said via; and
   electrically connecting the electrically conductive clip to the leadframe.

9. The method of claim 8, further comprising molding a molding material onto the electrically conductive clip, wherein said molded laser direct structuring material and said molding material provide an insulating package for the semiconductor chip.

10. The method of claim 8, wherein forming said paddle comprises plating an upper surface of the molded laser direct structuring material.

11. The method of claim 8, wherein attaching comprises solder welding the electrically conductive clip onto the paddle.

12. The method of claim 8, wherein attaching comprises laser welding the electrically conductive clip onto the paddle.

13. The method of claim 8, further comprising, prior to molding the laser direct structuring material, mounting a bonding wire between the leadframe and the semiconductor chip, and wherein said bonding wire is embedded in the molded laser direct structuring material.

* * * * *